(12) United States Patent
Liu et al.

(10) Patent No.: US 8,810,025 B2
(45) Date of Patent: Aug. 19, 2014

(54) REINFORCEMENT STRUCTURE FOR FLIP-CHIP PACKAGING

(75) Inventors: Yu-Wen Liu, Taipei (TW); Ching-Jung Yang, Pingzhen (TW); Hsien-Wei Chen, Sinying (TW); Hsin-Yu Pan, Taipei (TW); Chao-Wen Shih, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 207 days.

(21) Appl. No.: 13/050,125

(22) Filed: Mar. 17, 2011

(65) Prior Publication Data
US 2012/0235303 A1 Sep. 20, 2012

(51) Int. Cl.
*H01L 23/14* (2006.01)
*H01L 23/12* (2006.01)

(52) U.S. Cl.
USPC ..... 257/702; 257/700; 257/778; 257/E23.142

(58) Field of Classification Search
USPC .................. 257/700, 702, E23.142
See application file for complete search history.

(56) References Cited

U.S. PATENT DOCUMENTS

| | | | |
|---|---|---|---|
| 5,841,194 A | 11/1998 | Tsukamoto | |
| 5,874,043 A | 2/1999 | Sarkhel et al. | |
| 6,165,892 A * | 12/2000 | Chazan et al. | 438/623 |
| 6,300,250 B1 | 10/2001 | Tsai | |
| 6,310,391 B1 * | 10/2001 | Nagasawa et al. | 257/700 |
| 6,323,435 B1 * | 11/2001 | Strandberg et al. | 174/255 |
| 6,392,898 B1 * | 5/2002 | Asai et al. | 361/794 |
| 6,573,610 B1 | 6/2003 | Tsai | |
| 6,753,612 B2 | 6/2004 | Adae-Amoakoh et al. | |
| 7,148,560 B2 | 12/2006 | Lee et al. | |
| 7,378,745 B2 * | 5/2008 | Hayashi et al. | 257/778 |
| 7,429,797 B2 | 9/2008 | Coenen | |
| RE41,242 E * | 4/2010 | Asai et al. | 361/794 |
| 7,939,935 B2 * | 5/2011 | Chinda et al. | 257/700 |
| 8,076,782 B2 * | 12/2011 | Asai et al. | 257/774 |
| 2004/0222508 A1 * | 11/2004 | Aoyagi | 257/686 |
| 2007/0096291 A1 * | 5/2007 | Kawabata et al. | 257/700 |
| 2007/0161228 A1 * | 7/2007 | Nakamura et al. | 438/622 |

* cited by examiner

*Primary Examiner* — Nitin Parekh
(74) *Attorney, Agent, or Firm* — Haynes and Boone, LLP (57) ABSTRACT

The present disclosure provides a carrier substrate, a device including the carrier substrate, and a method of bonding the carrier substrate to a chip. An exemplary device includes a carrier substrate having a chip region and a periphery region, and a chip bonded to the chip region of the carrier substrate. The carrier substrate includes a reinforcement structure embedded within the periphery region.

17 Claims, 7 Drawing Sheets

REINFORCEMENT STRUCTURE FOR FLIP-CHIP PACKAGING

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased. As geometry size gets smaller, the packaging process of ICs becomes more challenging. One of the current packaging processes employs "flip chip" technology, where an IC is flipped and bonded with a carrier substrate. Temperature fluctuations in existing flip chip bonding processes may result in excessive thermal stress, which may then lead to warping of the IC package. Thus, while existing IC packaging has been generally adequate for its intended purposes, it has not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, descriptions of a first feature "on" or "over" a second feature (and like descriptions) may include embodiments where the first and second features are in direct contact, and may also include embodiments where additional features are interposed between the first and second features. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1A:
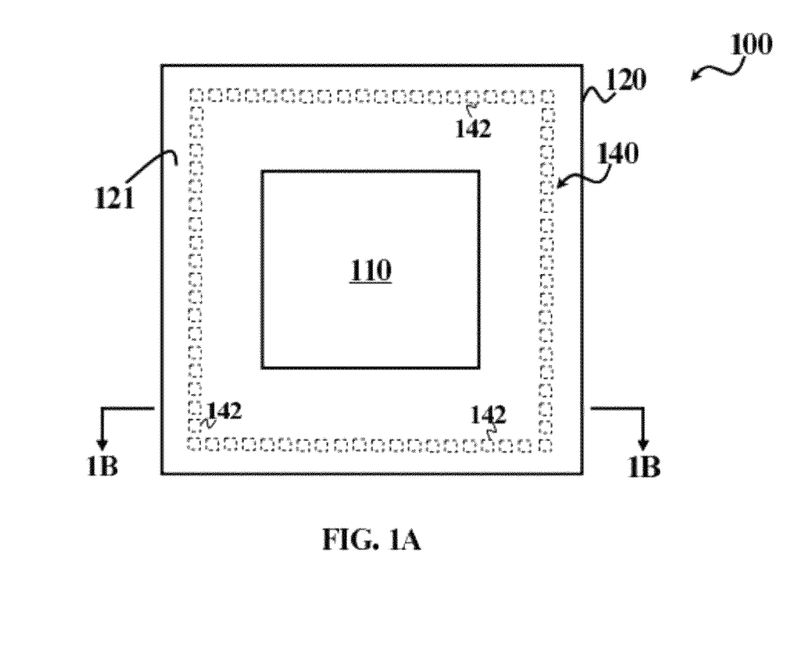
FIG. 1A is a top view of a device including a carrier substrate having a reinforcement structure in accordance with an embodiment of the present disclosure.
Figure 1B:
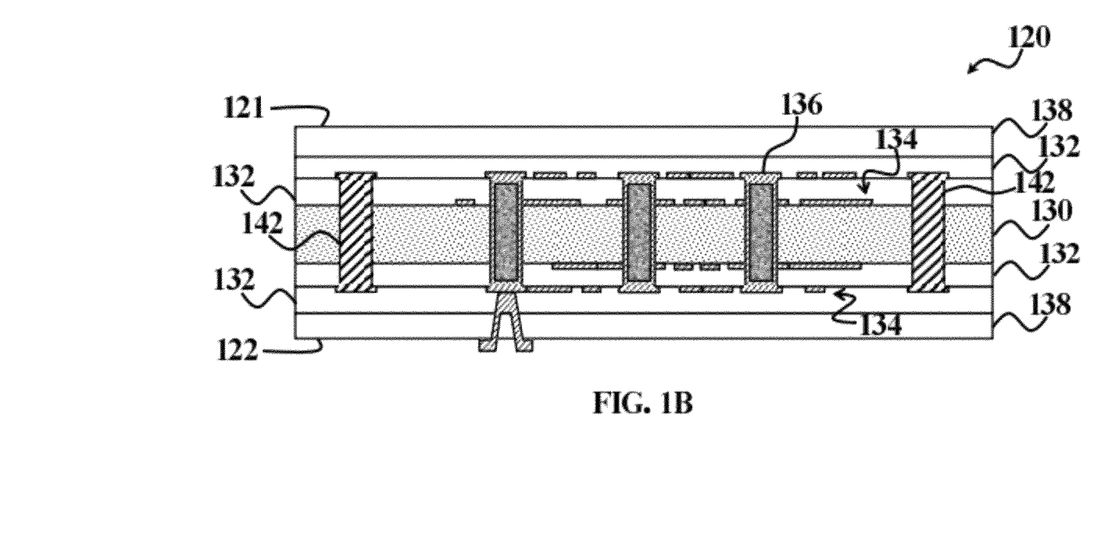
FIG. 1B is a diagrammatic sectional side view of the device taken along line 1B-1B of FIG. 1A.

FIG. 1A is a top view of a device 100 including a carrier substrate having a reinforcement structure in accordance with an embodiment of the present disclosure. FIG. 1B is a diagrammatic sectional side view of the device 100 taken along line 1B-1B in FIG. 1A. FIGS. 1A and 1B will be discussed concurrently and have been simplified for the sake of clarity to better understand the inventive concepts of the present disclosure. Additional features can be added in the device 100, and some of the features described below can be replaced or eliminated for other embodiments of the device 100.

The device 100 includes a chip 110 (also referred to as a die). The chip 110 may be an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. The chip 110 may include a microelectromechanical system (MEMS) device and/or a nanoelectromechanical system (NEMS) device.

The chip 110 includes a wafer (not illustrated), which is a semiconductor wafer in the present embodiment. For example, the wafer may be a silicon wafer. The wafer may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The wafer may include various doped regions (not illustrated), isolation features, other features, or combination thereof. The chip 110 also has an interconnect structure (not illustrated) formed over the wafer. The interconnect structure includes a plurality of patterned dielectric layers and conductive layers that provide interconnections (e.g., wiring) between the various doped regions and/or other features (for example, gate structures) of the wafer. For example, the interconnect structure includes an interlayer dielectric (ILD), which includes an insulating dielectric material such as a low-k material. The low-k material can be defined as a dielectric material having its dielectric constant less than about 3.9, that of a thermal silicon oxide. The low-k material may include carbon-doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials. The ILD may be formed by spin coating. In other embodiments, the ILD may include silicon oxide, silicon nitride, fluorosilicate glass (FSG), combinations thereof, or another suitable insulating material, and may be formed by CVD, PVD, ALD, or combinations thereof.

In the depicted embodiment, the chip 110 is "flipped" upside down (vertically rotated 180 degrees) and bonded to a carrier substrate 120. More specifically, an active surface of the chip 110 is electrically coupled with a surface 121 of the carrier substrate 120. Since the chip 110 is "flipped" upside down, instead of the active surface of the chip 110, a surface opposite the active surface is viewed in the top view of the device 100 in FIG. 1A. The chip 110 is bonded to the carrier substrate 120 by any suitable mechanism. For example, the chip 110 may include bonding pads over the interconnect structure, and solder balls (also referred to as solder bumps) may be formed on the bonding pads, respectively. The solder balls may be aligned with and come into contact with bonding pads of the carrier substrate 120, thereby producing electrical coupling between the chip 110 and the carrier substrate 120.

As noted, the carrier substrate 120 includes the surface 121, which the chip 110 is bonded to. The carrier substrate 120 also includes a surface 122 (FIG. 1B) that is opposite the surface 121. The carrier substrate 120 includes a chip region and a periphery region. The chip region is a region of the carrier substrate 120 configured for bonding to a chip. For example, the chip region is the region of the carrier substrate 120 that is bonded to the chip 110, which is not viewable in FIG. 1A. Accordingly, in the depicted embodiment, the chip region of the carrier substrate 120 is approximately a size of the chip 110. The chip region of the carrier substrate 120 may include bonding pads on the surface 121 for bonding with the chip 110, such as the bonding pad/solder ball structure of the chip 110. The periphery region of the carrier substrate 120 is a region of the carrier substrate 120 that is not configured for bonding to the chip. For example, in the depicted embodiment, the periphery region is the region of the carrier substrate 120 that is not bonded to the chip 110, the region of the carrier substrate 120 that is viewed in FIGS. 1A and 1B. It is noted that the device 100 may be a multi-chip package, where multiple chips 110 are bonded to the carrier substrate 120, such as a system-in-a-package (SIP). In the multi-chip package situation, the periphery region of the carrier substrate 120 includes any area of the carrier substrate 120 that is not bonded to one of the chips.

In the depicted embodiment, the carrier substrate 120 is a laminate substrate. The laminate substrate may be a plastic substrate or a ceramic substrate. Alternatively, the carrier substrate 120 may be a build-up substrate. Referring to FIG. 1B, the carrier substrate 120 is a multilayered substrate that includes a core layer 130, lamination carrier layers 132, and conductive layers 134 disposed within the lamination carrier layers 132. The conductive layers 134 include vias or plated through holes (PTHs) 136. In the depicted embodiment, the core layer 130 is a bismaleimide-triazine (BT) layer, the lamination carrier layers 132 are dielectric layers, such as polypropylene dielectric layers, and the conductive layers 134 are copper foil films and/or copper traces. The core layer 130 may include any other suitable epoxy material. The lamination carrier layers 132 may include other suitable epoxy and/or polymer materials. In the depicted embodiment, the multilayered substrate further includes a solder mask layer 138. The multilayered substrate may be formed by a method as is known in the art, or any suitable future-developed method. It is noted that the carrier substrate 120 may include any combination of core layers, lamination carrier layers, and conductive layers. For example, the carrier substrate 120 may be a four layer core structure, a two layer core structure, or any other suitable number of layers core structure. Further, the PTHs 136 may extend through a single layer or multiple layers of the carrier substrate 120.

A reinforcement structure 140 is embedded within the periphery region of the carrier substrate 120. The reinforcement structure encloses the chip 110. In the depicted embodiment, the reinforcement structure includes posts 142, which enclose the chip 110. The posts 142 are made of metal, such as copper or aluminum. The posts 142 may alternatively or additionally include non-metal materials, such as a suitable epoxy material, polymer material, or combination thereof. In an example, the posts 142 are made of a material having a higher modulus (such as Young's modulus, shear modulus, or bulk modulus) or hardness than a core of the carrier substrate 120 an/or a build-up material of the carrier substrate 120.

Referring to FIG. 1B, the posts 142, embedded within the carrier substrate 120, extend from the surface 121 to the surface 122. More specifically, the posts 142 of the reinforcement structure 142 extend through the core layer 130 and lamination carrier layers 132 including the conductive layers 134 (including the vias 136). Alternatively, the posts 142 may extend differently within the carrier substrate 120. For example, each of the posts 142 may have varying longitudinal lengths (a length of each post 142 that extends from the surface 121 to the surface 122). Further, each of the posts 142 may be positioned differently within the carrier substrate 120 (for example, some posts 142 may be disposed close to the surface 121, some posts may be disposed close to the surface 122, and/or some posts 142 may be disposed in the carrier substrate 120 such that ends of posts 142 are equidistant from the surfaces 121 and 122, respectively). In the depicted embodiment, each of the posts 142 has a square cross-section in the top view of FIG. 1A, and a rectangular cross-section in the diagrammatic sectional view of FIG. 1B. Alternatively, the cross-sections of each post 142 may have other shapes, such as a cross-shape, a cylindrical shape, an L-shape, a T-shape, or other suitable shape. The illustrated cross-sections for the posts 142 are not intended to be limiting, and it is understood that any appropriately shaped post 142 is contemplated by the present disclosure. Further, where there is an array of posts 142, as in the depicted embodiment, the array of posts 142 could alternatively include posts with different shapes. The posts 142 may have various dimensions. For example, a length of the posts 142 (as measured longitudinally) may be greater than or equal to about 50 µm, a width of the posts 142 may be greater than or equal to about 50 µm, and a depth of the posts 142 (distance between surface 121 of the carrier substrate 120 and a top surface of the posts 142) may be greater than or equal to about 20 µm. A distance between the reinforcement structure 140 and an edge of the chip 110 may be greater than or equal to about 50 µm, and a distance between the reinforcement structure 140 and an edge of the carrier substrate 120 is greater than or equal to about 300 µm.

The disclosed reinforcement structure 140 can reduce (or eliminate) warpage during packaging. For example, in conventional processing warpage of a carrier substrate may result from a mismatch of coefficients of thermal expansion (CTE) between the various materials (such as the materials of the chip and the carrier substrate)). In the depicted embodiment, the reinforcement structure 140 can minimize such warpage of the device 100 when the chip 110 is bonded to the carrier substrate 120, thereby reinforcing the device 100 (which can alternatively be referred to as a package). Such warpage may be reduced even while the device 100 is subjected to high temperature processes during the manufacturing process.

Figure 2A:
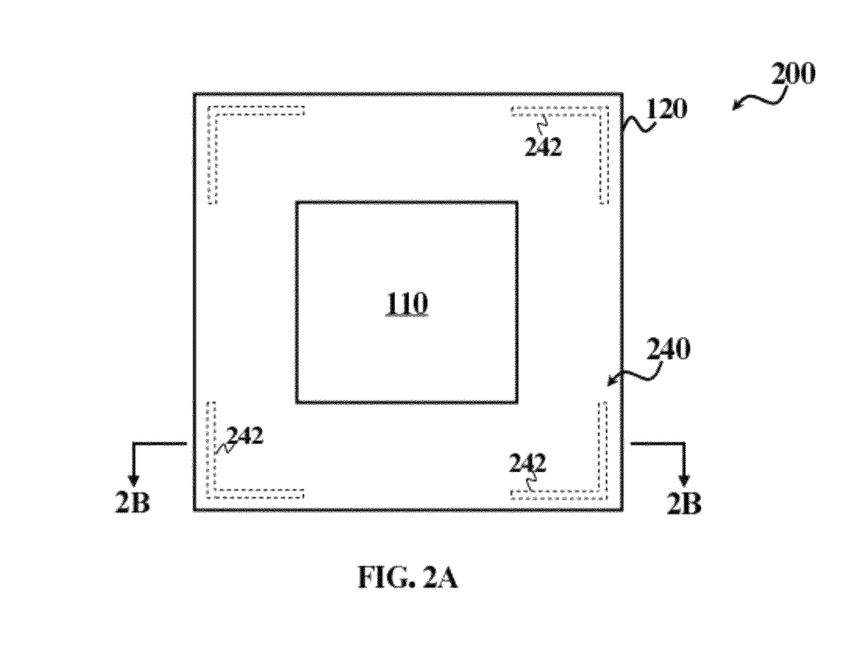
FIG. 2A is a top view of a device including a carrier substrate having a reinforcement structure in accordance with another embodiment of the present disclosure.
Figure 2B:
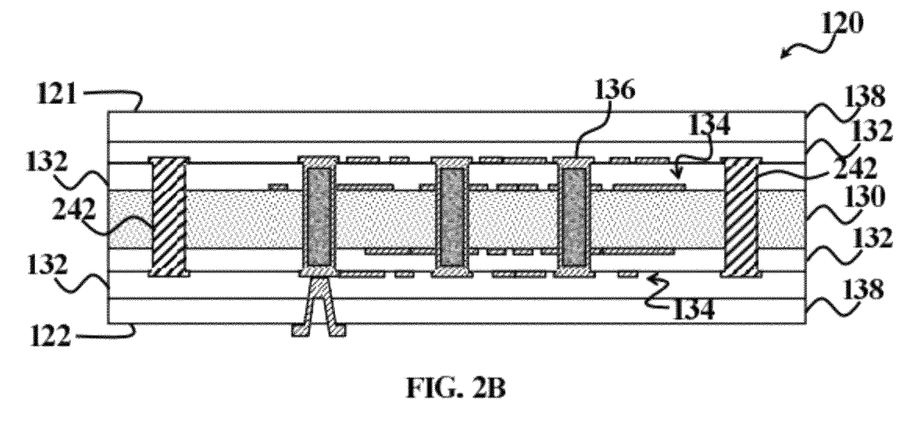
FIG. 2B is a diagrammatic sectional side view of the device taken along line 2B-2B of FIG. 2A.

FIG. 2A is a top view of a device 200 including a carrier substrate having a reinforcement structure in accordance with another embodiment of the present disclosure. FIG. 2B is a diagrammatic sectional side view of the device 200 taken along line 2A-2A. The embodiment of FIGS. 2A and 2B is similar in many respects to the embodiment of FIGS. 1A and 1B. Accordingly, similar features in FIGS. 1A-1B and 2A-2B are identified by the same reference numerals for clarity and simplicity. FIGS. 2A and 2B will be discussed concurrently and have been simplified for the sake of clarity to better understand the inventive concepts of the present disclosure. Accordingly, additional features can be added in device 200, and some of the features described below can be replaced or eliminated for other embodiments of the device 200.

Similar to the device 100, the device 200 includes the chip 110 bonded to the surface 121 of the carrier substrate 120. The carrier substrate 120 is a multilayered substrate that includes the core layer 130, lamination carrier layers 132, conductive layers 134 (including vias or plated through holes (PTHs) 136) disposed within the lamination carrier layers 132, and solder mask layers 138. In the depicted embodiment, a reinforcement structure 240 is embedded within the periphery region of the carrier substrate 120. The reinforcement structure 240 includes posts 242. More specifically, a post 242 is embedded within each corner of the carrier substrate 120. The posts 242 are made of metal, such as copper or aluminum. The posts 242 may alternatively or additionally include non-metal materials, such as a suitable epoxy material, polymer material, or combination thereof. In an example, the posts 242 are made of a material having a higher modulus (such as Young's modulus, shear modulus, or bulk modulus) or hardness than a core of the carrier substrate 120 an/or a build-up material of the carrier substrate 120.

Referring to FIG. 2B, the posts 242, embedded within the carrier substrate 120, extend from the surface 121 to the surface 122. More specifically, the posts 242 of the reinforcement structure 240 extend through the core layer 130 and lamination carrier layers 132 including the conductive layers 134 (including the vias 136). Alternatively, the posts 242 may extend differently within the carrier substrate 120. For example, each of the posts 242 may have varying longitudinal lengths (a length of each post 242 that extends from the surface 121 to the surface 122). Further, each of the posts 242 may be positioned differently within the carrier substrate 120 (for example, some posts 242 may be disposed close to the surface 121, some posts 242 may be disposed close to the surface 122, and/or some posts 242 may be disposed in the carrier substrate 120 such that ends of posts 242 are equidistant from the surfaces 121 and 122, respectively). In the depicted embodiment, each of the posts 242 has a L-shaped cross-section in the top view of FIG. 2A, and a rectangular cross-section in the diagrammatic sectional view of FIG. 2B. Alternatively, the cross-sections of each post 242 may have other shapes, such as a cross-shape, a cylindrical shape, an square shape, a T-shape, or other suitable shape. The illustrated cross-sections for the posts 242 are not intended to be limiting, and it is understood that any appropriately shaped post 242 is contemplated by the present disclosure. Further, where there is an array of posts 242, as in the depicted embodiment, the array of posts 242 could alternatively include posts with different shapes. For example, a length of the posts 242 (as measured longitudinally) may be greater than or equal to about 50 μm, a width of the posts 242 may be greater than or equal to about 50 μm, and a depth of the posts 242 (distance between surface 121 of the carrier substrate 120 and a top surface of the posts 242) may be greater than or equal to about 20 μm. A distance between the reinforcement structure 240 and an edge of the chip 110 may be greater than or equal to about 50 μm, and a distance between the reinforcement structure 240 and an edge of the carrier substrate 120 is greater than or equal to about 300 μm.

Similar to the reinforcement structure 140, the disclosed reinforcement structure 240 can reduce (or eliminate) warpage during packaging. For example, in conventional processing warpage of a carrier substrate may result from a mismatch of coefficients of thermal expansion (CTE) between the various materials (such as the materials of the chip and the carrier substrate)). In the depicted embodiment, the reinforcement structure 140 can minimize such warpage of the device 200 when the chip 110 is bonded to the carrier substrate 120, thereby reinforcing the device 200 (which can alternatively be referred to as a package). Such warpage may be reduced even while the device 200 is subjected to various high temperature processes during the manufacturing process.

Figure 3:
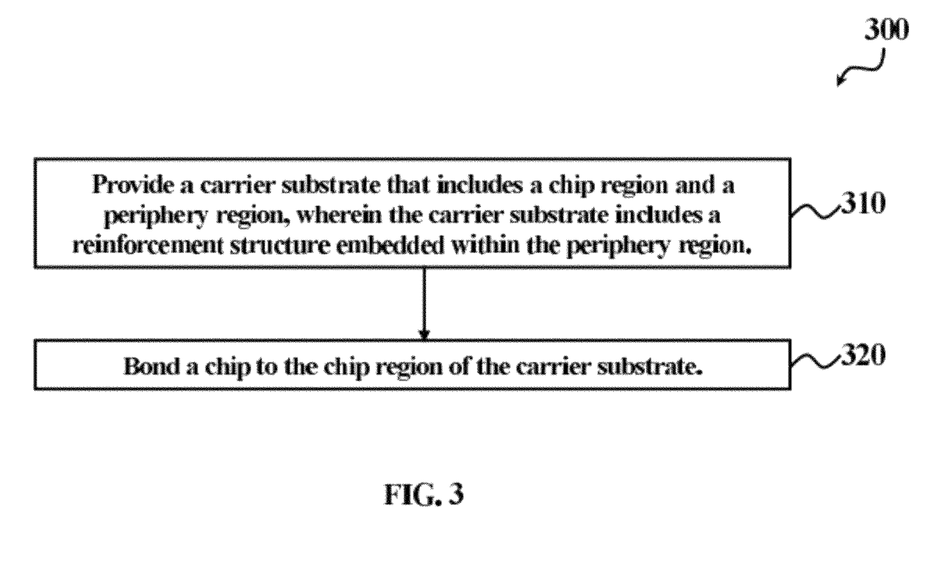
FIG. 3 is a flowchart illustrating a method of forming a device according to various aspects of the present disclosure.

FIG. 3 is a flowchart illustrating a method 300 of forming a device 400 according to various aspects of the present disclosure. More specifically, the method 300 provides for bonding a chip to a carrier substrate having a reinforcement structure, thereby forming a packaged device. The method 300 beings at block 310 where a carrier substrate having a chip region and a periphery region is provided. The carrier substrate includes a reinforcement structure embedded within the periphery region. At block 320, a chip is bonded the chip region of the carrier substrate. For example, the chip is bonded to the carrier substrate using a flip chip bonding process, in which a chip is flipped such that it is bonded to the carrier substrate. Additional steps can be provided before, during, and after the method 300.

Figure 4A:
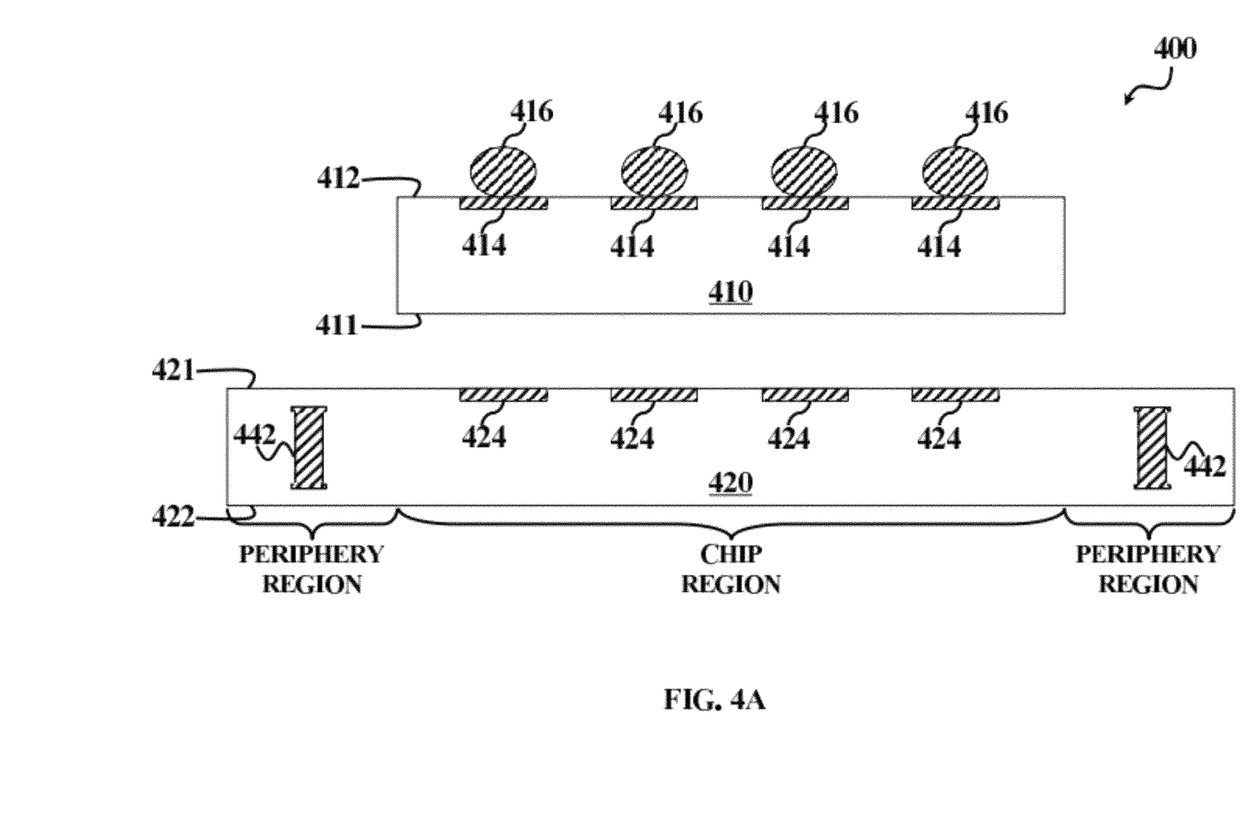
FIGS. 4A-4B are diagrammatic sectional side views of the device at various stages in accordance with an embodiment of the method of FIG. 3.
Figure 4B:
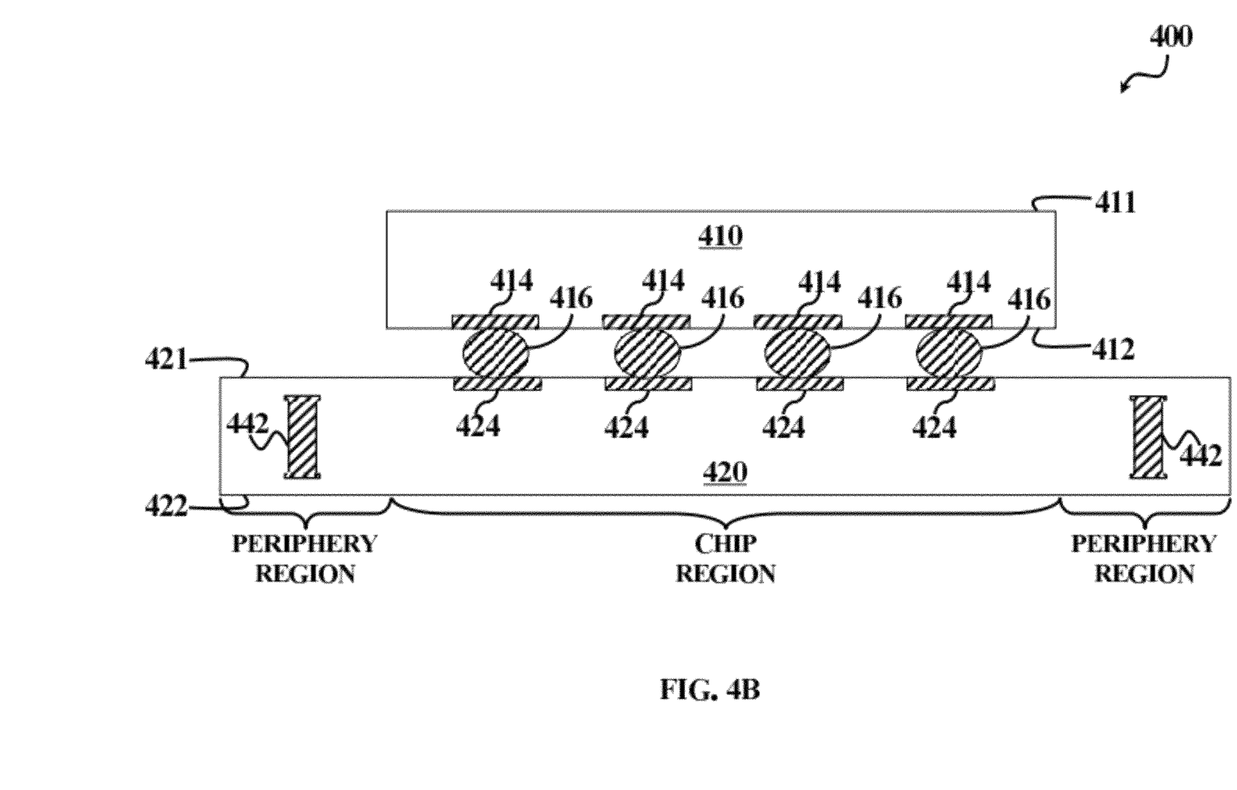

FIGS. 4A-4B are diagrammatic sectional side views of a device 400 at various stages of the method 300 of FIG. 3. FIGS. 4A-4B have been simplified for a better understanding of the inventive concepts of the present disclosure. Additional features can be added in the device 400, and some of the features described below can be replaced or eliminated for additional embodiments of the device 400.

Referring to FIG. 4A, a chip 410 (also referred to as a die) is provided. The chip 410 may be an integrated circuit (IC) chip, system on chip (SoC), or portion thereof, that may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. The chip 110 may include a microelectromechanical system (MEMS) device and/or a nanoelectromechanical system (NEMS) device.

The chip 410 includes a wafer (not illustrated), which is a semiconductor wafer in the present embodiment. For example, the wafer may be a silicon wafer. The wafer may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The wafer may include various doped regions (not illustrated), isolation features, other features, or combination thereof. The chip 410 also has an interconnect structure (not illustrated) formed over the wafer. The interconnect structure includes a plurality of patterned dielectric layers and conductive layers that provide interconnections (e.g., wiring) between the various doped regions and/or other features (for example, gate structures) of the wafer. For example, the interconnect structure includes an interlayer dielectric (ILD), which includes an insulating dielectric material such as a low-k material. The low-k material can be defined as a dielectric material having its dielectric constant less than about 3.9, that of a thermal silicon oxide. The low-k material may include carbon-doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials. The ILD may be formed by spin coating. In other embodiments, the ILD may include silicon oxide, silicon nitride, fluorosilicate glass (FSG), combinations thereof, or another suitable insulating material, and may be formed by CVD, PVD, ALD, or combinations thereof.

The chip 410 has a surface 411 and a surface 412 that is opposite the surface 412. In the depicted embodiment, the surface 412 may be referred to as an active surface of the chip 410. The chip 410 includes bonding pads 414 disposed along the surface 412. The bonding pads 414 are formed over the interconnect structure. The bonding pads 414 are formed of conductive materials. In an example, the bonding pads 414 may include an under-bump-metallization (UBM) structure. The UBM structure may include various layers (for example, various layers of metal) that provide adequate adhesion to the bonding pads 414 and protection for the underlying materials. Solder balls (also referred to as solder bumps) 416 are formed on the bonding pads 414, respectively. The solder balls 416 may be formed by evaporation, electroplating, printing, jetting, stud bumping, or other suitable techniques. The solder balls 416 include a conductive material, for example, lead. The UBM structure also provides wetting for the solder balls 416.

A carrier substrate 420 is also provided. The carrier substrate 420 may be similar in composition to the carrier substrate 120 described above. For example, the carrier substrate 420 may be a multilayered laminate substrate. The carrier substrate 420 includes a surface 421 and a surface 422 that is opposite the surface 421. The carrier substrate 420 includes a chip region and a periphery region. The chip region may be a size that is approximately equal to the size of the chip. The chip region is a region of the carrier substrate 420 configured for bonding to a chip. For example, in the depicted embodiment, the chip region of the carrier substrate 420 includes bonding pads 424, which are disposed along the surface 421. The bonding pads 424 are similar to the bonding pads 424. The periphery region of the carrier substrate 420 is a region of the carrier substrate 420 that is not configured for bonding to the chip. In the depicted embodiment, the carrier substrate 420 includes a reinforcement structure embedded in the periphery region. The reinforcement structure includes posts 442. The posts 442 may be similar to the posts 142 and 242 described with reference to FIGS. 1A-1B and FIGS. 2A-2B, respectively. The posts 442 are made of metal, such as copper or aluminum. The posts 442, embedded within the carrier substrate 420, extend from the surface 421 to the surface 422.

Referring to FIG. 4B, the chip 410 is "flipped" upside down (vertically rotated 180 degrees) and placed on the carrier substrate 420. The solder balls 416 are aligned with and come into contact with the bonding pads 424. Thereafter, the solder balls 416 are melted to produce electrical coupling between the carrier substrate 420 and the chip 410. For example, the solder balls 416 are melted in a reflow oven (also referred to as a furnace) using a reflow process. The temperatures at which the solder balls 416 are melted are referred to as reflow temperatures. A flux material (not illustrated) may be applied on the bonding pads 414 and/or on the bonding pads 424 to facilitate the bonding between the chip 410 and the carrier substrate 410. The flux material may include tin or rosin and acts as a wetting agent in the reflow process. An underfill material (not illustrated) may be dispensed to fill the empty space in between the chip 410 and the carrier substrate 420, the space also being referred to as a bonding interface. The underfill material may be an adhesive material, such as a liquid epoxy containing $SiO_2$. The underfill material may serve as a sealant to prevent exposure of the surfaces of the chip 410 and the carrier substrate 420, and thus prevents corrosion of the chip 410 and the carrier substrate 420. Furthermore, the underfill material may act as a cushion to absorb and alleviate stress between the chip 410 and the carrier substrate 420 during various thermal processes that may follow. The underfill material may be cured in an underfill curing process, so as to harden or toughen the underfill material.

As the chip 410 and the carrier substrate 420 undergo temperature changes during the flip chip bonding process, the chip 410 and the carrier substrate 420 will contract at rates that are dependent on their respective coefficients of thermal expansion (CTE). Often times, there is a mismatch between the CTE of the chip 410 and the CTE of the carrier substrate 420. This mismatch of the CTEs means that the chip 410 and the carrier substrate 420 are contracting at different rates, which causes stress between the chip 410 and the carrier substrate 420. This stress can cause cracking or delamination of one or more layers of the chip 410—for example, delamination or cracking of the low-k material layer. Further, the solder balls 416 may also suffer from cracking or delamination as the stress becomes sufficiently great. Such cracking or delamination leads to the device 400 exhibiting warpage. In the disclosed embodiment, the disclosed reinforcement structure 442 can reduce (or eliminate) such warpage. More specifically, the reinforcement structure 442 can minimize such warpage of the device 400 when the chip 410 is bonded to the carrier substrate 420, thereby reinforcing the device 400 (which can alternatively be referred to as a package). Such warpage may be reduced even while the device 400 is subjected to high temperature processes during the manufacturing process.

The device 400 may be used in a ball grid array (BGA) package. For example, solder balls (bumps) may be formed on the surface 422 of the carrier substrate 420, such that the carrier substrate 420 may electrically and/or mechanically interconnect the chip 410 to other microelectronic devices, such as a printed circuit board (PCB). In an example, the solder bumps secure the device 400 to a circuit board, such as a PCB, and electrically interconnect circuitry of the chip 410 to the circuit board. In an example, the carrier substrate 420 may be a PCB. The device 400 may be used in other types of packaging.

Thus, the present disclosure provides a reinforcement structure embedded within a carrier substrate that can reinforce and reduce warpage of flip-chip packages. For example, compared to conventional packages, the disclosed packages including the carrier substrate having a reinforcement structure embedded within the periphery region have been observed to reduce package warpage by about 20%, reduce UBM maximum principal stress by about 7%, and reduce pre-solder maximum principal stress by about 5%. The disclosed reinforcement structure thus improves mechanical and/or thermal performance of flip-chip packages. Different embodiments may have different advantages, and no particular advantage is necessarily required of any embodiment.

In an example, a device includes a carrier substrate having a chip region and a periphery region, and a chip bonded to the chip region of the carrier substrate. The carrier substrate includes a reinforcement structure embedded within the periphery region. The reinforcement structure may include metal, such as copper. In an example, the carrier substrate includes a first surface and a second surface opposite the first surface, and the reinforcement substrate extends within the carrier substrate from the first surface to the second surface. The chip may includes an active surface and another surface opposite the active surface, wherein the active surface of the chip is electrically coupled to one of the first surface and the second surface of the carrier substrate. The reinforcement structure may enclose the chip. For example, the reinforcement structure may includes a plurality of posts disposed within the carrier substrate, where the plurality of posts enclose the chip. In another example, the reinforcement structure is disposed in a corner of the carrier substrate. The reinforcement structure may be have any suitable shapes, for example, the reinforcement structure may be L-shaped. The carrier substrate may be a laminate substrate. In an example, the laminate substrate includes bismaleimide-triazine (BT).

In another example, a package substrate includes a laminate substrate including a chip region and a periphery region, the chip region being configured for bonding to a chip, and a reinforcement structure embedded within the periphery region of the laminate substrate. The reinforcement structure may include a plurality of post structures. In an example, the plurality of post structures enclose the chip region. The reinforcement structure may be disposed in a corner of the laminate substrate. The reinforcement structure may include metal. The laminate substrate may include a plurality of dielectric layers having a plurality of metal layers disposed therein, wherein the reinforcement structure extends through the plurality of dielectric layers.

In yet another example, a method includes providing a carrier substrate that includes a chip region and a periphery region, wherein the carrier substrate includes a reinforcement structure embedded within the periphery region; and bonding a chip to the chip region of the carrier substrate. The bonding the chip includes using a flip chip bonding process. The providing the carrier substrate may include forming a laminate substrate, wherein the reinforcement structure is formed while forming the laminate substrate.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device comprising:
   a carrier substrate having a chip region and a periphery region spaced a lateral distance from and surrounding the chip region, wherein the chip region includes a plurality of bonding pads on a surface of the carrier substrate, and wherein the carrier substrate includes a core layer and a lamination carrier layer disposed on at least one surface of the core layer, the lamination layer including a dielectric material and a conductive layer disposed in the dielectric material;
   a reinforcement structure embedded within the periphery region of the carrier substrate, wherein the reinforcement structure contiguously extends through the core layer, the dielectric material and the conductive layer and wherein the reinforcement structure is a contiguous L-shaped structure that has an edge that parallels each of two sides of the carrier substrate that terminate in a corner of the carrier substrate; and
   a chip bonded to the chip region of the carrier substrate, wherein the chip is bonded to each of the plurality of bonding pads.

2. The device of claim 1 wherein the reinforcement structure includes metal.

3. The device of claim 2 wherein the metal is copper.

4. The device of claim 1 wherein the reinforcement structure encloses the chip.

5. The device of claim 1 wherein the reinforcement structure includes a plurality of posts disposed within the carrier substrate, the plurality of posts enclosing the chip.

6. The device of claim 1 wherein the carrier substrate is a laminate substrate.

7. The device of claim 6 wherein the core of the laminate substrate includes bismaleimide-triazine (BT).

8. The device of claim 1, wherein the lateral distance does not include wiring structures coupled to the chip.

9. The device of claim 1, wherein the reinforcement structure includes at least one of an epoxy material and a polymer material.

10. The device of claim 1, wherein the reinforcement structure is not electrically connected to the chip.

11. The device of claim 1, wherein the reinforcement structure has a top end surface nearest the chip and an opposing bottom end surface, wherein the top end surface has an interface only with the lamination carrier layer.

12. A package substrate comprising:
    a laminate substrate including a chip region and a periphery region spaced a distance from the chip region and wherein the laminate substrate includes a core layer having top and bottom surfaces and a lamination carrier layer formed on each of the top surface and the bottom surface of the core layer, wherein:
    the chip region is configured for bonding to a chip and includes conductive elements providing an interconnection to the chip; and
    a reinforcement structure is embedded within the periphery region of the laminate substrate, wherein the reinforcement structure is not electrically connected to the conductive elements providing the interconnection to the chip, wherein the reinforcement structure extends through the core layer and each of the lamination carrier layers and wherein the reinforcement structure is a contiguous structure disposed in a corner of the laminate substrate, wherein the contiguous structure includes a first portion parallel and adjacent a first side of the laminate substrate and a second side parallel a second portion parallel and adjacent a second side of the laminate substrate, wherein the first and second sides of the laminate substrate form the corner.

13. The package substrate of claim 12 wherein the reinforcement structure includes a plurality of post structures.

14. The package substrate of claim 13 wherein the plurality of post structures enclose the chip region.

15. The package substrate of claim 12 wherein the lamination carrier layers are dielectric layers, wherein at least one dielectric layer has metal layer disposed therein, wherein the reinforcement structure extends through the plurality of dielectric layers.

16. The package substrate of claim 12 wherein the reinforcement structure includes metal.

17. The package substrate of claim 12, wherein the reinforcement structure has a top end surface and an opposing bottom end surface, wherein the top end surface and the bottom end surface each interface with one of the lamination carrier layers.

* * * * *